(12) United States Patent
Cortigiani et al.

(10) Patent No.: US 9,077,240 B2
(45) Date of Patent: Jul. 7, 2015

(54) SEMICONDUCTOR DEVICE INCLUDING SHORT-CIRCUIT PROTECTION

(71) Applicant: Infineon Technologies AG, Neubiberg (DE)

(72) Inventors: Fabrizio Cortigiani, Padova (IT); Adolfo De Cicco, Padova (IT)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 14/018,878

(22) Filed: Sep. 5, 2013

(65) Prior Publication Data

US 2014/0077782 A1    Mar. 20, 2014

(30) Foreign Application Priority Data

Sep. 20, 2012 (EP) .................................... 12185259

(51) Int. Cl.
*H02H 3/08* (2006.01)
*H02M 3/156* (2006.01)
*H03K 17/082* (2006.01)
*H02J 7/00* (2006.01)

(52) U.S. Cl.
CPC ................. *H02M 3/156* (2013.01); *H02H 3/08* (2013.01); *H02J 2007/0039* (2013.01); *H03K 17/0822* (2013.01)

(58) Field of Classification Search
USPC ................................................ 361/93.7–93.9
See application file for complete search history.

(56) References Cited

U.S. PATENT DOCUMENTS

| 5,994,790 | A | * | 11/1999 | Nagashima et al. | ......... 307/10.1 |
| 8,270,138 | B2 | * | 9/2012 | Takahashi et al. | ............. 361/101 |
| 2003/0072120 | A1 | * | 4/2003 | Ishikawa et al. | ............... 361/93.9 |
| 2008/0002325 | A1 | * | 1/2008 | Kato et al. | ..................... 361/101 |
| 2011/0110009 | A1 | * | 5/2011 | Sugimoto et al. | ............. 361/93.1 |
| 2013/0114307 | A1 | * | 5/2013 | Fang | .......................... 363/21.01 |

* cited by examiner

*Primary Examiner* — Danny Nguyen
(74) *Attorney, Agent, or Firm* — Shumaker & Sieffert, P.A.

(57) ABSTRACT

A semiconductor device is described that includes a switch to switch a load current path on and off according to an input signal. The device further includes an over-current detector to compare a load current with a threshold and to signal an over-current when the load current reaches or exceeds the threshold. The device further includes a control unit to set the threshold to a higher value while in a first state of operation and to a lower value while in a second state of operation, and to at least temporarily switch the switch off when an over-current is signalled, change from the first state of operation to the second state of operation when a first pre-defined time span has elapsed, and to change from the from the second state of operation to the first state when the switch is off for more than a second pre-defined time span.

13 Claims, 4 Drawing Sheets

SEMICONDUCTOR DEVICE INCLUDING SHORT-CIRCUIT PROTECTION

TECHNICAL FIELD

The present invention relates to the field of semiconductor devices and methods for operating such devices.

BACKGROUND

Semiconductor devices, especially power semiconductor devices such as power semiconductor switches often include a current and temperature measurement functionality for detecting faulty or undesired modes of operation during which undesirably high currents or temperatures occur. Such faulty or undesired modes of operation may be, inter alia, an over-load (e.g., a short circuit) or an over-temperature.

Power semi-conductor switches capable of detecting an over-temperature, an over-load (short-circuit), etc. are often referred to as "smart switches". Typically such smart switches include at least one power transistor (e.g. a DMOS high-side switch) and an over-current detection circuit for each power transistor that compares a measured load current signal, which represents the load current flowing through the transistor, with a defined threshold value that represent a specific maximum current. When the load current reaches or exceeds the maximum current, the load current is switched off in order to protect the device.

SUMMARY

The problem to be solved by the present invention is to provide a semiconductor device including a semiconductor switch and an over-current protection which allows a robust operation even when the semiconductor switch is driven by an on/off-modulated drive signal.

The above-mentioned problem is solved by the semiconductor device of claim 1. Various embodiments and further developments of the inventive concept are covered by the dependent claims.

A semiconductor device is described In accordance with a first example of the invention the semiconductor device includes an electronic switch that is configured to switch a load current path between a supply terminal having a supply voltage and an output circuit node on and off in accordance with an input signal. The device further includes an over-current detector that is configured to compare a load current signal that represents the load current passing through the load current path with an over-current threshold and to signal an over-current when the load current signal reaches or exceeds the over-current threshold. Furthermore, the device includes a control unit that is operable in a first and a second state of operation. The control unit is configured to set the over-current threshold to a first, higher value while in the first state of operation and to a second, lower value while in the second state of operation, and to at least temporarily switch the electronic switch off when an over-current is signalled. A change from the first state of operation to the second state of operation is caused when a first pre-defined time span has elapsed, and a change from the second state of operation to the first state of operation when the electronic switch is off for more than a second pre-defined time span.

A further aspect of the invention relates to a method for controlling an electronic switch to activate or inactivate a load current path between a supply terminal and an output circuit node using a state machine. The state machine may operate at least in a first state, a second state, and a third state of operation. The load current, which passes through the load current path is monitored, and an over-current is signalled when the load current reaches or exceeds an adjustable over-current threshold. The over-current threshold is set to a higher first value while in the first state and to a lower second value while in the second state.

A control signal is generated to activate and deactivate the electronic switch in accordance with an input signal. However, the electronic switch is de-activated when an over-current is signalled and re-activated after a blanking time unless a counter indicates that an over-current has been detected for a pre-set maximum number of times. This pre-set maximum number is higher in the first state than in the second state. Furthermore, the electronic switch is de-activated and a change to the third state is triggered when either the maximum number of over-current events has been detected or another safety-relevant criterion is met. The third state is maintained until a reset command is received. A change from the first state to the second state is triggered when a specific time span has elapsed. Furthermore, a change from the second state to the first state is triggered when the electronic switch has been off for at least a minimum off time or when a minimum time span has elapsed while in the second or third state. A change from the third state to the second state is triggered when the reset command is received.

BRIEF DESCRIPTION OF THE DRAWINGS

The various embodiments can be better understood with reference to the following drawings and descriptions. The components in the figures are not necessarily to scale, instead emphasis is placed upon illustrating the principles of the invention. Moreover, in the figures, like reference numerals designate corresponding parts. In the drawings.

DETAILED DESCRIPTION

Figure 1:
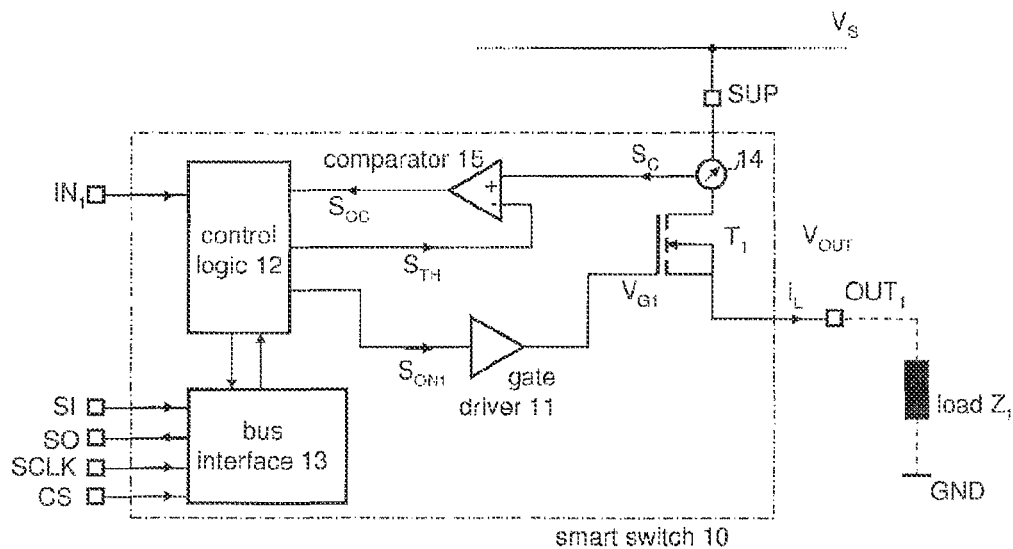
FIG. 1 illustrates the basic structure of a smart switch including an over-current protection.

The present invention relates to the field of semiconductor devices and methods for operating such devices, particularly to power semiconductor devices including a fault detection capability for detecting faulty operating states that lead to a rise in temperature such as, for example, short circuits.

As mentioned above, semiconductor devices, especially power semiconductor devices such as power semiconductor switches often include a current and temperature measurement functionality for detecting faulty or undesired modes of operation during which undesirably high currents or temperatures occur. Such faulty or undesired modes of operation may be, inter alia, an over-load (e.g., a short circuit) or an over-temperature.

Power semi-conductor switches capable of detecting an over-temperature, an over-load (short-circuit), etc. are often referred to as "smart switches". Typically such smart switches include at least one power transistor (e.g. a DMOS high-side switch) and an over-current detection circuit for each power transistor that compares a measured load current signal, which represents the load current flowing through the transistor, with a defined threshold value that represent a specific maximum current. When the load current reaches or exceeds the maximum current, the load current is switched off in order to protect the device.

However, in many applications smart switches have to handle high inrush currents. This may be the case, e.g., when switching on incandescent lamps, electric motors or the like. The inrush currents are typically much higher than the maximum current yet, the high inrush currents are transient and usually do not cause a dangerous over-temperature. However, the over-current protection circuit included in the smart switch needs to distinguish between high inrush currents and over-currents resulting from a short circuit. For this reason the threshold, which determines the maximum current, is set to a higher value (higher than during normal operation) during a start-up phase in which transient inrush currents may occur. This start-up phase is usually defined as a fixed time interval (e.g., 10 ms) that stars with the switch-on of the transistor. When this time interval has elapsed, the threshold, which determines the maximum current, is reset to the lower—nominal—value.

When an over-current is detected (i.e. when an over-current event occurs) the device may be deactivated. That is, the device is latched in an inactive state (failure state) in which the load current is switched off. However, to avoid a de-activation during the start-up phase the device is re-activated after an over-current event for a defined number of times (e.g. 32 times). However, the device is finally deactivated (and not re-activated) when the maximum number of over-current events has occurred during the start-up phase. After the start-up phase (i.e. during normal operation), a single over-current event is sufficient for latching the device in an inactive state (failure state).

The transition between the start-up phase with a high maximum current threshold and the phase of normal operation with a low maximum current threshold is usually triggered by a digitally implemented finite state machine (FSM). A further problem arises, however, when the smart switch is used to supply the load (e.g. the incandescent lamp) with a modulated signal (e.g. a pulse-width modulated load current). The load current supplied to a lamp may be, for example, pulse-width modulated, to reduce the average load current supplied to the lamp in order to dim the lamp. As a consequence, in known smart switches a new start-up phase would be initiated in every cycle of the pulse width modulation (PWM). This is particularly problematic when the time span defining the start-up phase is longer as one period of the modulated signal. When considering an example it will become evident, that this is practically always the case. Let the start-up phase be a time interval of, for example, 10 ms starting at the time instant when the semiconductor switch is activated (i.e. switched on). Further, let the load current be pulse width modulated with a PWM carrier frequency of 200 Hz, which is a typical frequency used for dimming a lamp (or controlling the rotational speed of an electric motor). As a PWM carrier frequency of 200 Hz corresponds to a PWM period of 5 ms the semiconductor switch is activated every 5 ms, while the start-up phase would last 10 ms. In the presented example, the start-up phase, during which the higher load current threshold is valid, would never end.

The problem to be solved by the present invention is to provide a semiconductor device including a semiconductor switch and an over-current protection which allows a robust operation even when the semiconductor switch is driven by an on/off-modulated drive signal.

As discussed in the introductory part, high inrush currents may occur after activation of the load current flowing through considered semiconductor device. The semiconductor device may include, for example, a power transistor (e.g. a DMOS n-channel high-side transistor) that controls the switching state of a load, e.g., a lamp. When switching on a cold incandescent lamp the inrush currents (generally referred to as the load current $i_L$) may be a multiple of the nominal load current which flows through the load during normal operation that follows the start-up phase. It may happen that, shortly after switching on the lamp, the load current flowing through the load current path of the transistor rises above a specific limit (i.e. a pre-defined over-current threshold value) which would be unacceptable for a longer period of time since such high currents might lead to an undesired degradation of the device or even to the thermal destruction of the device.

FIG. 1 illustrates, as an example, the basic structure of a so-called smart switch 10. It should be noted that the illustration is not exhaustive as only those components are shown that are relevant for the further discussion. The smart switch usually includes one or more semiconductor chips which are arranged within one chip package. A semiconductor switch $T_1$ (e.g. a high-side n-channel DMOS transistor) is integrated in a silicon chip, wherein the load current path (i.e. the drain-source current path in case of a MOS transistor) is connected between a supply terminal SUP and an output terminal $OUT_1$. The supply terminal SUP is usually connected with a supply pin of the chip package which is supplied with a supply voltage $V_S$ via a supply line. The output terminal $OUT_1$ is usually connected with an output pin of the chip package, and an electric load $Z_1$ (e.g. a lamp) may be connected between the output pin and, e.g., ground potential GND. Smart switches may have a plurality of output channels, wherein one semiconductor switch and one corresponding output pin is provided for each channel. The examples discussed herein only show a smart switch with a single channel for the sake of a clear and simple illustration.

A gate driver 11 is coupled to the control electrode of the power transistor $T_1$ (e.g. the gate electrode in case of a MOS transistor) and generates a drive signal $V_G$ (e.g. a gate current or a gate voltage) in accordance with a respective control signal $S_{ON1}$ supplied to the gate driver 11. In the present example the driver signal is appropriate to switch the power transistor $T_1$ on when the control signal $S_{ON1}$ is "1" (i.e. a high logic level) and to switch the power transistor T1 off when the control signal $S_{ON1}$ is "0" (i.e. a low logic level). However, the logic levels may be reversed, dependent on the application.

The smart switch 10 includes an over-current detector associated with the power transistor $T_1$ which is configured to detect whether the load current $i_L$ flowing through the power transistor $T_1$ exceeds a specific maximum current. In the present example the over-current detector includes a current measurement circuit 14 that is configured to provide a current measurement signal $S_C$, which represents the load current $i_L$, and a comparator 15 which receives, as input signal, the current measurement signal $S_C$ and an over-current threshold $S_{TH}$, which determines the maximum current, and which is configured to compare the input signals and to generate an over-current signal $S_{OC}$. The over-current signal OC is indicative of whether, or not, the current measurement signal $S_C$ is higher than the over-current threshold $S_{TH}$ (if $S_C > S_{TH}$, then OC=1, else OC=0). The over-current signal OC may be a binary signal, wherein, e.g., a high logic level may indicate an over-current. The current measurement circuit may be—in a simple implementation—a single current measurement resistor coupled in series to the load current path of the respective transistor $T_1$. However, more complex current measurement circuits may be used. For example, the power transistor $T_1$ may have a so-called sense-transistor coupled thereto which allows current measurement in a separate measurement current path. However, those and other current measurement circuits are as such known in the field and thus not further discussed herein.

A control logic circuit 12 may be provided for controlling the switching behavior of the transistor $T_1$. The control logic circuit 12 receives an input signal $IN_1$ and generates the corresponding control signal $S_{ON1}$ dependent on, inter alia, the input signal $IN_1$ and the over current signal ($S_{OC}$). During normal operation the control signal $S_{ON1}$ equals $IN_1$ (i.e., $S_{ON1}=IN_1$). In case of a multi-channel smart switch an input signal and a respective control signal as well as an over current signal is provided for each channel. The control logic 12 may be formed using discrete logic circuit components such as timers, counters, gates, comparators etc. Alternatively, a micro controller may be used that executes software appropriate to perform the same function. Further, the control logic 12 may be partly implemented using discrete circuit components and partly using a micro controller. The function of the control logic 12 may be implemented as a finite state machine (FSM) which is described below with reference to FIG. 2.

When the semiconductor device (the smart switch in the present example) is powered on, that is when the supply voltage $V_S$ applied to the supply terminal SUP rises above a minimum level, the finite state machine starts with state $X_0$ in which the load current $i_L$ is switched off and all timers and counters are reset to appropriate initial values. The state $X_0$ can be regarded as a "standby state" in which the power switch is "waiting" and ready to be switched on.

When the input signal $IN_1$ indicates that the load current $i_L$ is to be switched on, then the finite state machine changes to state $X_1$ which can be regarded as "start-up state" that represents the start-up phase, during which high inrush currents may occur. At the same time the corresponding control signal $S_{ON1}$ is set to a logic level appropriate to switch on the transistor $T_1$ (e.g. $S_{ON1}=1$) and a timer is started (timer value $T_{ON}$). The start-up phase will end, at the latest, when the timer value $T_{ON}$ indicates that a pre-defined time span (e.g. 10 ms) has elapsed. In the state $X_1$ the over-current threshold $S_{TH}$ is set to a first, comparably high threshold value ($S_{TH}=S_{HI}$). When the over-current signal $S_{OC}$ indicates an over-current then the finite state machine changes to state $X_3$, in which an over-current counter $count_{OC}$ is incremented. When (after incrementing the over-current counter $count_{OC}$) the number of over-current events indicated by the counter $count_{OC}$ is smaller than a maximum number ($count_{OC}<max_{OC}$), then—after a fixed delay time (blanking time, e.g. 100 µs)—the finite state machine falls back to state $X_1$. Otherwise (i.e. when the maximum number of over-current events have been detected), the finite state machine changes to failure state $X_4$ and, as a result, the load current is finally switched off, e.g., by setting $S_{ON1}=0$.

As mentioned above, during the start-up period the inrush current may trigger an over-current event several times and thus the finite state machine will toggle between the state $X_1$ and state $X_3$ unless the maximum number $max_{OC}$ of over-current events is reached (e.g. $max_{OC}=32$). If the load is an incandescent lamp, the finite state machine might toggle between states $X_1$ and $X_3$, e.g. 15 times and then remain in the state $X_1$ until the timer value $T_{ON}$ indicates that the pre-set time interval defining the start-up phase is over. The finite state machine then changes to state $X_2$ and the over-current threshold $S_{TH}$ is set to a second, lower threshold value ($S_{TH}=S_{LO}$). This state $X_2$ represents the normal operation of the smart switch. The finite state machine will remain in this state until either the input signal $IN_1$ indicates that the load current is to be switched off (e.g. $IN_1=0$) or an over-current (using the lower threshold, however) is detected. In the first case, the finite state machine falls back to state $X_0$ (leading to a reset of all timers and counters) and, in the second case, the finite state machine changes to the failure state $X_4$ without allowing any toggling. Once in the failure state $X_4$, an external reset command or a new power-on is required to bring the state machine back to the state $X_0$.

Referring again to FIG. 1, the smart switch 10 further includes a bus interface 13 that is coupled to the control logic 12 (state machine) via communication lines for exchanging data between the control logic 12 and the bus interface 13. Generally, the bus interface 13 is configured to forward data from or to an external bus, e.g. a serial bus, such as the standardized SPI bus (serial peripheral interface bus). In the present example the bus interface 13 is a serial peripheral interface (SPI) which is connected to the external chip package pins SI, SO, SCLK, CS for connecting, for example, to an external bus master device. Serial data may be received via the SI pin (SI=serial input), whereas serial data is sent via the SO pin (SO=serial out). The serial bus communication is clocked via a clock signal received over the SCLK pin (SCLK=serial clock). Finally the bus interface 13 may be activated and de-activated via a so-called chip select signal, which may be received via the CS pin (CS=chip select). As the serial peripheral interface is as such known, the details concerning the bus interface are not further discussed here. Any data or signal occurring within the control logic 12 may be digitized and sent to an external bus master device via the bus interface 13. It should be noted that different bus systems may have a different number of pins and may use different signals for data transmission.

Figure 2:
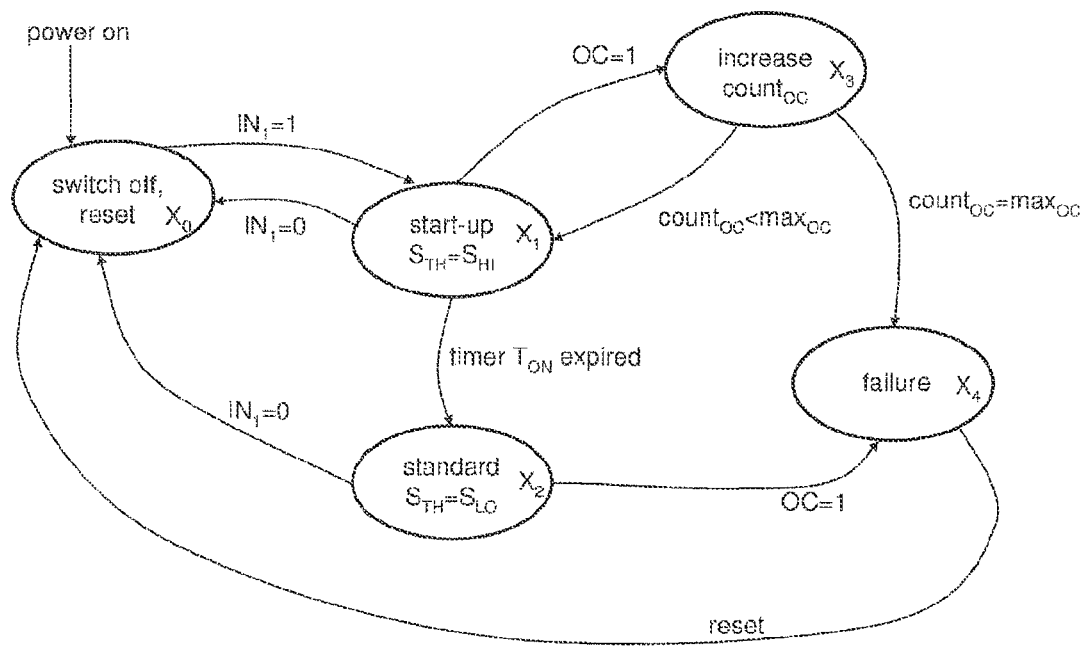
FIG. 2 illustrates a finite state machine that controls the operation of the smart switch of FIG. 1.
Figure 3:
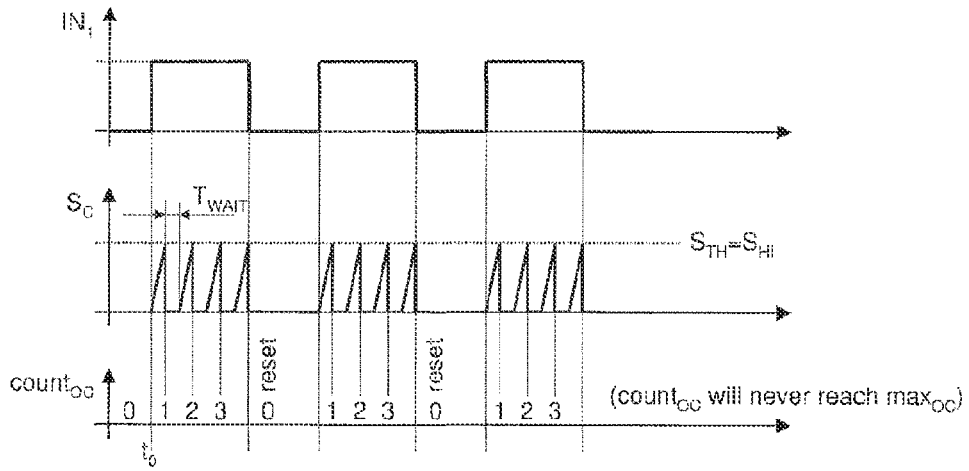
FIG. 3 includes timing diagrams for illustration of the relevant signals occurring in the state machine of FIG. 2.

The function of the state machine described with reference to FIG. 2 is further discussed with reference to the timing diagrams depicted in FIG. 3. The upper diagram illustrates the waveform of the input signal $IN_1$, which may be used to generate a, e.g. pulse width modulated, load current, when the load is shortcircuited. The transition from a low to a high level in the input signal $IN_1$ triggers a switch-on of the power transistor $T_1$. The state machine changes from the standby state $X_0$ to the start-up state $X_1$. As a consequence of the short circuit, the load current rapidly rises and causes an over-current event (OC=1). The state machine temporarily changes to state $X_3$, de-activates the load current flow, increments the over-current event counter $count_{OC}$ and, after a delay time $T_{WAIT}$ (e.g. $T_{WAIT}=100$ µs), falls back to state $X_1$, re-activating the load current flow. The re-activation of the load current triggers the next over-current event and the cycle starts over. This toggling stops when the duty cycle of the input signal $IN_1$ is over and the input signal $IN_1$ is reset to a low level, which causes the state machine to change to the standby state $X_0$. In the standby state the over-current event counter $count_{OC}$ is reset. In the present example the duty cycle of the pulse width modulated input signal $IN_1$ is so short, that—even in case of a short circuit—the maximum number $max_{OC}$ of over-current events will never be reached. As a consequence the state machine will never fall into the failure state $X_4$ and an over-heating of the switch may be possible.

Generally, the de-activation of the switch in every PWM period entails the reset of the counter that counts the over-current events observed during the start-up phase. Additionally, each de-activation of the switch entails a reset of the timer $T_{ON}$ that measures whether the time span defining the start-up phase has elapsed or not. Thus, the state machine never reaches the normal operation (state $X_2$). To alleviate or resolve this problem an improved state machine is needed.

Figure 4:
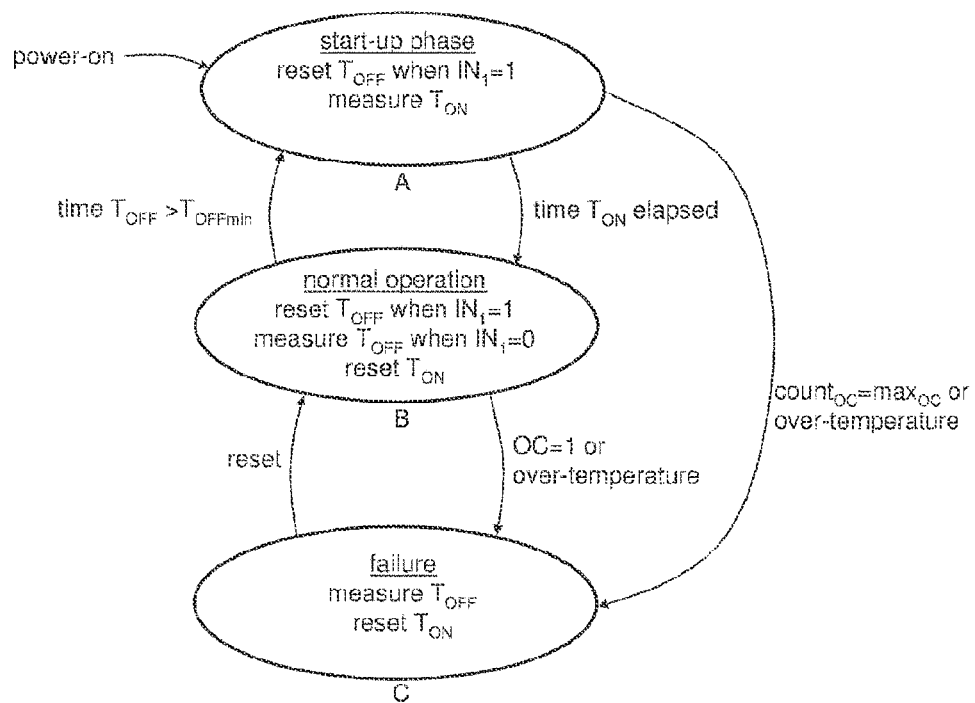
FIG. 4 illustrates a simplified state machine in accordance with one example of the present invention.

In accordance with one example of the invention a smart switch as illustrated in FIG. 1 includes a control logic circuit 12 which implements a state machine in accordance with the illustration of FIG. 4. As compared with the exemplary state machine of FIG. 2 the illustration in FIG. 4 has been simplified with regard to the on/off switching of the power semiconductor switch. The states (labeled A, B, and C) depicted in FIG. 4 instead refer to general states in which the switching operation follows specific rules. The function implemented by the finite state machine of FIG. 4 is described in general terms below and subsequently some specific examples are discussed using the timing diagrams of FIGS. 5 and 6.

As soon as the smart switch is coupled with the supply voltage, the finite state machine starts in the start-up state A. Initially all timers and counters are reset. In state A, the load current flow is deactivated (i.e. transistors $T_1$ is switched off, see example of FIG. 1) when the input signal is at a low level ($IN_1$=0). Conversely, the load current flow is activated (i.e. transistors $T_1$ is switched on, see example of FIG. 1) when the input signal changes to a high level ($IN_1$=1). A first timer measures the time (on-time $T_{ON}$) during which the power transistor $T_1$ is active. A second timer, which measures the off-time of the power transistor (off-time $T_{OFF}$) is reset when the transistor $T_1$ is switched on. In the start-up state A the input signal $IN_1$ may be regularly switched on and off in accordance with a modulation scheme that provides a specific duty cycle. For example, in input signal $IN_1$ may be pulse width modulated with a constant PWM carrier frequency. In the start-up state A an over-current event does not immediately lead to a final deactivation of the device, but a defined number of "retries" are allowed. The device is only latched in a failure state (state C) when a maximum number of over-current events have been observed. This behaviour corresponds to the behaviour of the state machine described with reference to FIG. 2. Further, an over-temperature shut-down is initiated when the temperature (or a temperature gradient) measured in the semiconductor device exceeds a specific maximum. Summarizing the above, the start-up state A ends when one of the following criteria is fulfilled:

the on-time $T_{ON}$ reaches a specific limit $T_{ONmax}$ (i.e. when the on-time $T_{ON}$ has elapsed),
a maximum number of over-current events have been observed ($count_{OC}=max_{OC}$),
an over-temperature shut-down is triggered.

In the first case, the finite state machine changes to state B (normal operation), whereas in the second and third case, the finite state machine is latched in the failure state.

When entering the state B (normal operation) the first timer that measures the on-time $T_{ON}$ is reset. Further, the PWM switching operation of the power transistor $T_1$ may continue as in the start-up state. However, a single over-current event (OC=1) is sufficient to latch the state machine in the failure state (state C). As in the previous example, during normal operation the over-current threshold is lower than in the start-up state A. An over-temperature also leads to a deactivation of the power transistor $T_1$ and a transition of the state machine into the failure state C. During the state B (normal operation) the second timer that measures the off-time $T_{OFF}$ is reset each time the load current is activated (i.e. $IN_1$ switches to $IN_1$=1). The second timer (off-time $T_{OFF}$) only runs while the power transistor is off ($IN_1$=0). When the off-time $T_{OFF}$ exceeds a specific minimum off-time $T_{OFFmin}$ (i.e. when $T_{OFF}>T_{OFFmin}$) then the finite state machine again changes to the start-up state A and the next activation of the power transistor $T_1$ will initiate a new start-up phase during which high inrush currents may occur. Instead of measuring the time $T_{OFF}$ during which the power transistor $T_1$ is switched off, a time span $T_{OFF}'$ may be measured, which represents the time since the state machine has left the first state A, i.e. the time span that has passed since the end of the start-up phase (and entering the second or third state). A new start up phase will be initiated when the time span exceeds a pre-defined minimum time $T_{OFFmin}'$. Which alternative is used (minimum off time $T_{OFFmin}$ or minimum time span $T_{OFFmin}'$) may be configured, e.g. by sending appropriate commands via the serial bus (SPI bus).

The third state C in the example of FIG. 4 is the already-mentioned failure state C. In this state the power transistor $T_1$ is maintained in an inactive state ($S_{ON1}$=0) regardless of the level of the input signal $IN_1$. That is, the input signal $IN_1$ Is blanked and not forwarded to the gate driver 11 of the power transistor $T_1$. However, the second timer $T_{OFF}$ measures the off-time $T_{OFF}$ during this state. The smart switch is latched in this failure state C until an (external) reset command is received by the state machine (i.e. by the control logic circuit 12). This "reset command" may be a single bit binary signal, which may be set to an appropriate logic level upon receiving a corresponding command over the external serial bus interface 13 (see FIG. 1). The reset signal is sometimes also referred to as "clear signal". When receiving a reset command the state machine changes to state B. When, in the meantime, the measured off-time $T_{OFF}$ is greater than the minimum off-time $T_{OFFmin}$ the state-machine changes to the start-up state and the next activation of the power transistor $T_1$ will initiate a new start-up phase during which high inrush currents may occur. If the minimum off-time $T_{OFFmin}$ has not been reached, the state-machine remains in the state B (normal operation). Generally, the minimum off time $T_{OFFmin}$ is comparably long, e.g. $T_{OFFmin}$=200 ms, and at least ten times longer than a switching period of the input signal $IN_1$ in cases where the input signal $IN_1$ is an on/off-modulated signal, e.g. a PWM signal. The minimum off time $T_{OFFmin}$ should be, however, long enough to allow the electronic switch to cool down to or below a specified temperature.

Figure 5:
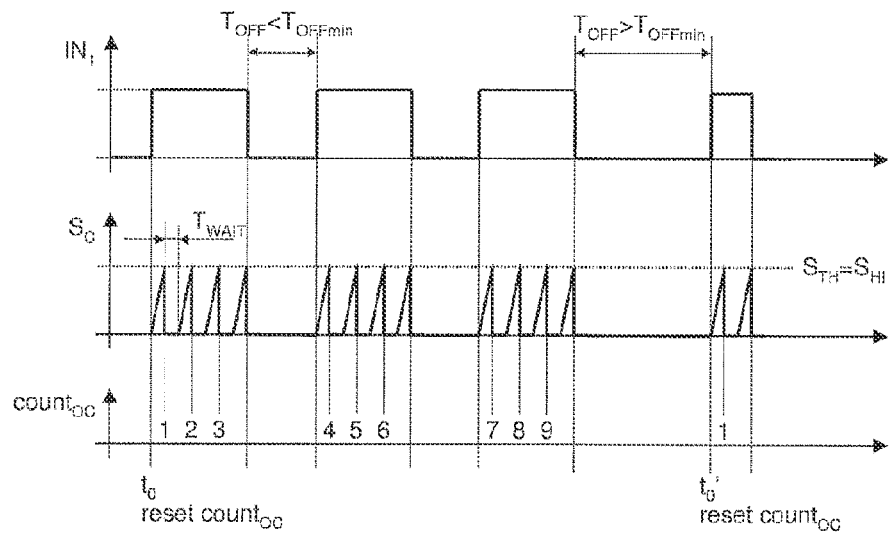
FIG. 5 includes timing diagrams for illustration of the relevant signals occurring in the state machine of FIG. 4 in a first exemplary situation.

The above described general function of the state machine will now be further illustrated by a more specific example. The timing diagrams of FIG. 5 illustrate the behaviour of the state machine of FIG. 4 when the load connected to the smart switch is short-circuited. The top timing diagram of FIG. 5 illustrates the on/off modulated input signal $IN_1$. Initially, the switching operation begins in state A (start-up state). The first transition (at time $t_0$) from $IN_1$=0 to $IN_1$=1 starts the first timer, which measures the on-time $T_{ON}$. Between the time instants $t_0$ and $t_1$ the input signal $IN_1$ is at a high level ($IN_1$=1) and thus the state machine tries to switch-on the power transistor $T_1$. In response to a switch-on of the transistor $T_1$ the load current immediately rises until the measured load current signal $S_C$ reaches the (high) over-current threshold $S_{TH}=S_{HI}$. This is illustrated in the middle timing diagram of FIG. 5. The bottom diagram illustrates the counter value countOC, which counts the observed over-current events. During the first duty cycle (time span $t_1-t_0$) of the input signal $IN_1$, three over-current events are detected. The input signal changes to $IN_1$=0 just before the fourth over-current event is caused. Between the time instants $t_1$ and $t_2$ the power transistor is off and the above-mentioned second timer measures the off-time $T_{OFF}$. As the time spans $T_{OFF}=t_2-t_1=t_4-t_3$ are lower than the minimum off time $T_{OFFmin}$ the counter $count_{OC}$ is not reset and further incremented upon detection of the over-current events that occur during the following duty cycles of the input signal $IN_1$. At the end of the third duty cycle, the counter $count_{OC}$ indicates nine over-current events. The following off-period $T_{OFF}=t_0'-t_5$ of the input signal is longer than the minimum off-time $T_{OFFmin}$ and thus a "new" start-up phase is initiated with the next transition of the input signal from $IN_1=0$ to $IN_1=1$. The counter $count_{OC}$ is reset and incremented from zero to $count_{OC}=1$ upon detection of the next over-current event. One can see that, in contrast to the example of FIG. 3, a de-activation of the load current does not automatically reset the counter $count_{OC}$. The counter $count_{OC}$ is only reset when the load current is inactive for at least the minimum off-time $T_{OFF}$, whereby the minimum off-time may be comparably long, e.g., $T_{OFF}=200$ ms.

Figure 6:
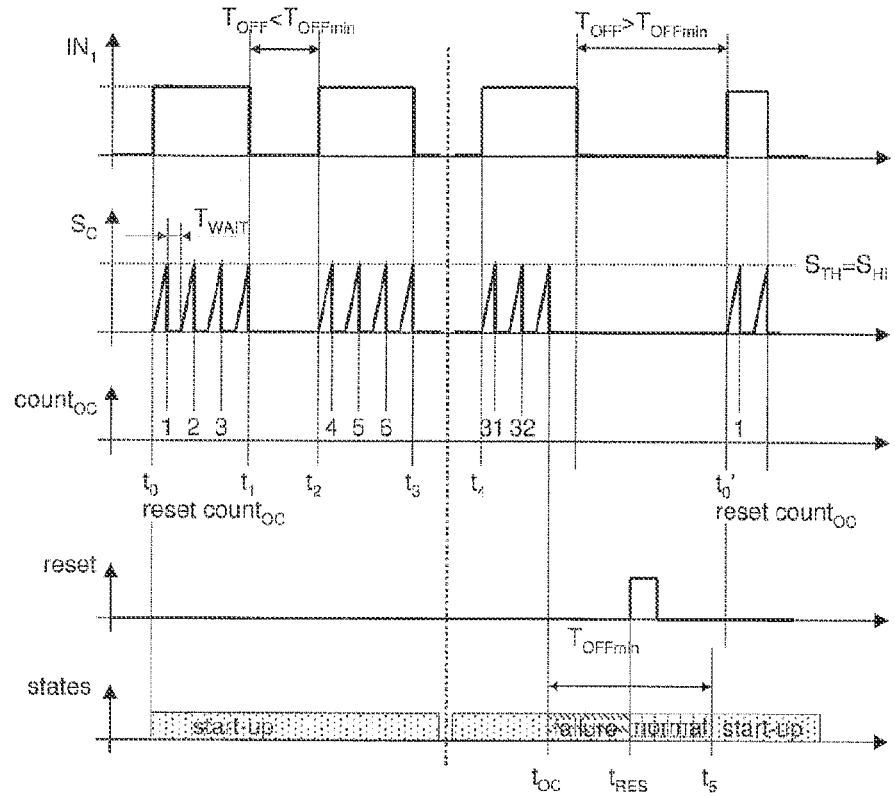
FIG. 6 includes timing diagrams for illustration of the relevant signals occurring in the state machine of FIG. 5 in a second exemplary situation.

The example of FIG. 6 illustrates the transition of the state machine of FIG. 4 from the start-up state A into the failure state C as a result of the over-current counter reaching the maximum number $max_{OC}$ of detected over-current events, and further a transition to state B (normal operation) due to a reset command. The first (counted from top to bottom) timing diagram of FIG. 6 illustrates the on/off-modulated input signal $IN_1$. The second timing diagram illustrates the corresponding measured load current signal $S_C$ for a short-circuited load. The third diagram illustrates the value of the over-current event counter $count_{OC}$. The fourth diagram illustrates the reset signal, and the fifth diagram (bottom) illustrated the state (start-up, normal operation, or failure) in which the state machine operates in accordance with the state diagram of FIG. 4. Initially, the switching operation begins in state A (start-up state). The first transition (at time $t_0$) from $IN_1=0$ to $IN_1=1$ starts the first timer, which measures the on-time $T_{ON}$. Between the time instants $t_0$ and $t_1$ the input signal $IN_1$ is at a high level ($IN_1=1$) and thus the state machine tries to switch-on the power transistor $T_1$. In response to a switch-on of the transistor $T_1$ the load current immediately rises until the measured load current signal $S_C$ reaches the (high) over-current threshold $S_{TH}=S_{HI}$. After a short delay $T_{WAIT}$ of, e.g., 100 μs the state machine tries to switch the transistor $T_1$ on again, which causes another over-current event. Similarly, the number of observed over-current events increases during the following duty cycles of the input signal $IN_1$ until the, e.g. $32^{nd}$ over-current event (occurring at a time $t_{OC}$) triggers a transition of the finite state machine into the failure state C and a final switch-off of the power transistor $T_1$. While in the failure state C the input signal $IN_1$ is ignored. However, the second timer measures the off-time $T_{OFF}$ for which the power transistor is switched off. At a time $t_{RES}$ a reset signal is received. As at the time $t_{RES}$, the measured off-time has not reached the value $T_{OFFmin}$ (i.e. $T_{OFF}<T_{OFFmin}$) the state machine changes to state B (normal operation) without further changing to the start-up state A. At the time $t_5$ the measured off-time $T_{OFF}$ equals the minimum off-time (i.e. $T_{OFF}=T_{OFFmin}$) and thus the state machine changes again to the start-up state A and the next activation of the power transistor $T_1$ at the time $t_0'$ will allow the load current to rise up to the high current threshold applicable in the start-up state before the next over-current event is caused.

In some applications a reset command is sent in regular intervals. A state machine as illustrated in FIG. 2 could lead to an over-heating of the smart switch as after each reset the state machine is restarted in the start-up phase (see FIG. 2, state $X_1$). The exemplary state machine of FIG. 4, however, will prevent a transition to the start-up state (see FIG. 4, state A) unless a minimum off-time $T_{OFFmin}$ has elapsed. This prevents a permanent operation of the state machine in the start-up state in which the high current threshold $S_{TH}=S_{HI}$ applies even in cases when the state machine is externally reset in regular time intervals.

Figure 7:
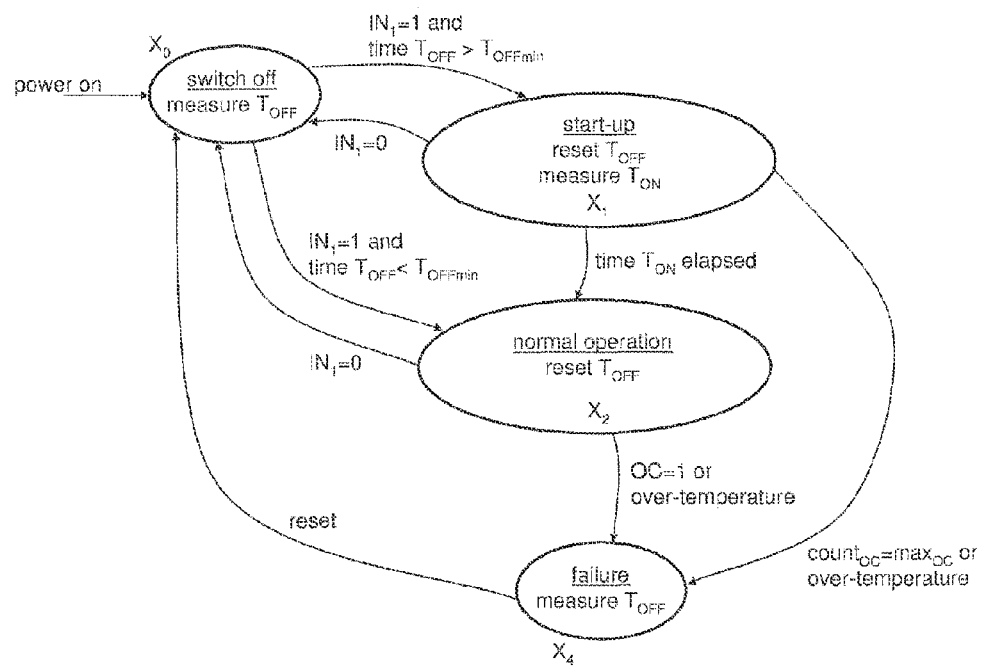
FIG. 7 illustrates the state machine of FIG. 4 in more detail.

FIG. 7 illustrates another, more detailed example of the state machine shown in FIG. 4. In the present example, the state, in which the power transistor is switched off is illustrated as separate state, i.e. switch-off state $X_0$. When entering state $X_0$ for the first time after power-on, the time $T_{OFF}$ is initialized with a value greater than $T_{OFFmin}$. Alternatively, it can be otherwise ensured (e.g., using a flag), that the smart switch is first started in the start-up-mode when the input signal $IN_1$ changes to a high level for the first time after power on. Furthermore, the first timer, measuring the on-time $T_{ON}$ is reset to zero once after power-on. Generally, the state machine changes to the (active) start-up state $X_1$ when the input signal changes to a high level ($IN_1=1$) and when the switch has been off for longer than a minimum off-time $T_{OFFmin}$ ($T_{OFF}>T_{OFFmin}$). When the input signal $IN_1$ returns to a low level, then the state machine falls back to the switch-off state $X_0$. The state machine may toggle between the state $X_0$ and the state $X_1$ several times until the first timer indicates that a maximum on-time $T_{ON}$ has elapsed. It should be noted that the first timer is started (and $T_{ON}$ measured) when the gate driver tries to switch on the transistor $T_1$ (e.g. when the control signal $S_{ON1}$ is set to a high level) after a reset of the timer. The state machine changes to state $X_2$ (normal operation), when a maximum on-time $T_{ON}$ has elapsed, i.e. when $TON>T_{ONmax}$. As in the previous example, a single over-current event is sufficient to bring the state machine in the failure state $X_4$, whereas a number $max_{OC}$ of over-current events is required to achieve the same result when the state machine is in the state $X_1$. Furthermore, the over-current threshold is lower ($S_{TH}=S_{LO}$) in the state $X_2$. In any state, a single over-temperature event is sufficient to bring the state machine into the failure state $X_4$.

The state-machine is latched in the failure state $X_4$ until a reset or clear signal is received. As mentioned above in the previous examples, the off-time of the power transistor is measured by a second timer $T_{OFF}$ and thus, a reset signal, received while $T_{OFF}<T_{OFFmin}$ will bring the state machine in the state $X_2$ (normal operation) via state $X_0$ if $IN_1=1$. Generally, the state machine is not allowed to change to the start-up mode again before the minimum off-time $T_{OFFmin}$ has lapsed.

Below some important general aspects of the above-described exemplary embodiments are summarized. However, the following is not regarded to be complete or exhaustive. Accordingly, the semiconductor device described herein includes an electronic switch that is configured to switch a load current path between a supply terminal SUP, which is to be supplied with a supply voltage $V_S$, and an output circuit node $OUT_1$ on and off in accordance with an input signal $IN_1$. The semiconductor device further includes an over-current detector (current measurement circuit 14, comparator 15) that is configured to compare a load current signal $S_C$ that represents the load current $i_L$ passing through the load current path with an over-current threshold $S_{TH}$ and to signal an over-current $S_{OC}$ when the load current signal $S_C$ reaches or exceeds the over-current threshold $S_{TH}$. A control unit is operable in a first state A (start-up phase) and a second state B of operation (normal operation) and is configured to generate a control signal $S_{ON1}$ to switch the electronic switch $T_1$ on and off in accordance with the input signal $IN_1$, to set the over-current threshold $S_{TH}$ to a first, higher value ($S_{TH}=S_{HI}$) while in the first state A of operation and to a second, lower value ($S_{TH}=S_{LO}$) while in the second state B of operation, to at least temporarily switch the electronic off when an over-current is signalled, to change from the first state A of operation to the second state B of operation when a first pre-defined time span $T_{ONmax}$ has elapsed, and to change from the from the second state B of operation to the first state A of operation when the electronic switch is off for more than a second pre-defined time span $T_{OFFmin}$. Particularly, the introduction of the minimum off-time inhibits the device from getting "stuck" in the first state of operation (start-up phase) with the high current threshold.

The control unit may further be operable in a third state C (failure mode) of operation. The control unit may be configured to change to the third state C of operation when a pre-defined safety-relevant criterion is met. In this state a control signal $S_{ON1}$ is generated to switch the electronic switch $T_1$ off. A change from the third state C of operation to the second state B (failure mode to normal operation) is triggered not before a reset command is received.

A further aspect of the invention relates to a method for controlling the electronic switch $T_1$ to activate or inactivate the load current path between the supply terminal SUP and the output circuit node $OUT_1$. A state machine is employed which may operate at least in a first state (start-up-phase), a second state (normal operation), and a third state (failure mode) of operation. The load current $i_L$, which passes through the load current path is monitored, and an over-current is signalled (e.g. by setting a flag $S_{OC}=1$) when the load current reaches or exceeds an over-current threshold $S_{TH}$. The over-current threshold is adjustable and can be set to a higher first value while being in the first state (start-up phase) and to a lower second value while being in the second state (normal operation). A control signal $S_{ON1}$ is generated to activate and deactivate (via the gate driver 11) the electronic switch $T_1$ in accordance with an input signal $IN_1$. However, the electronic switch is de-activated when an over-current is signalled and re-activated after a blanking time $T_{WAIT}$ unless a counter count$_{OC}$ indicates that an over-current has been detected for a pre-set maximum number max$_{OC}$ of times (e.g. that count$_{OC}$≥max$_{OC}$). This pre-set maximum number max$_{OC}$ is higher in the first state A (e.g. max$_{OC}$=32) than in the second state (e.g. max-$_{OC}$=1). Furthermore, the electronic switch is deactivated and a change to the third state (failure mode) is triggered when either the maximum number of over-current events has been detected or another safety-relevant criterion is met (e.g. a maximum chip temperature is exceeded). The third state C is maintained until a reset command is received (e.g. via the serial bus interface). A change from the first state A to the second state B (start-up phase to normal operation) is triggered when a specific time span $T_{ONmax}$ has elapsed. Furthermore, a change from the second state B to the first state A (normal operation to start-up phase) is triggered when the electronic switch has been off for at least a minimum off time $T_{OFFmin}$. A change from the third state (failure mode) to the second state is triggered when the reset command is received.

In one example, semiconductor device comprises an electronic switch (T1) that is configured to switch a load current path between a supply terminal having a supply voltage (VS) and an output circuit node (OUT1) on and off in accordance with an input signal (IN1); an over-current detector (14, 15) that is configured to compare a load current signal (SC) that represents the load current (iL) passing through the load current path with an over-current threshold (STH) and to signal an over-current (SOC) when the load current signal (SC) reaches or exceeds the over-current threshold (STH); a control unit (12) operable in a first (A) and a second state (B) of operation and configured to: generate a control signal (SON1) to switch the electronic switch (T1) on and off in accordance with the input signal (IN1); set the over-current threshold (STH) to a first, higher value (SHI) while in the first state of operation and to a second, lower value (SLO) while in the second state of operation, at least temporarily switch the electronic off when an over-current is signaled, change from the first state of operation to the second state of operation when a first pre-defined time span (TONmax) has elapsed, and change from the from the second state of operation to the first state of operation when the electronic switch is off for more than a second pre-defined time span (TOFFmin) or when a pre-defined minimum time span has elapsed since leaving the first state.

In some examples, the control unit of the semiconductor device is further operable in a third state (C) of operation and configured to: change to the third state (C) of operation when a pre-defined safety-relevant criterion is met; generate a control signal (SON1) to switch the electronic switch off (T1); and change from the third state (C) of operation to the second state (B) of operation when a reset command is received. In some of these examples, the pre-defined safety-relevant criterion is one or more of the following: an over-current is signaled for a pre-set maximum number (maxOC) of times; a temperature of the semiconductor device exceeds a pre-defined maximum temperature, wherein the pre-set maximum number (maxOC) is different in different states (A, B) of operation.

In some examples, the semiconductor device includes a first timer configured to measure an off-time (TOFF) of the electronic switch, the timer being reset each time the electronic switch (T1) is activated and being only actively measuring time when the electronic switch is off. In some examples, the semiconductor device includes a second timer configured to measure an on-time (TON), the timer being reset before or when the control unit (12) changes to the first state (A) of operation and being only actively measuring time when the control unit (12) is in the first state (A) of operation.

In some examples, in the first state (A) of operation, the control unit (12) of the semiconductor device is configured to count the number of times (countOC) an over-current is signaled by the over-current detector (14, 15) and, when an over-current is signaled, to deactivate the electronic switch, and to re-activate the electronic switch after a blanking time (TWAIT) unless the counted number (countOC) of over-current events has reached a maximum number (maxOC). In some examples, maximum number (maxOC) is different in the first and in the second state of operation.

In some examples, the semiconductor device includes a serial bus interface coupled to the control unit (12) and configured to enable a data exchange between the control logic circuit (12) and an external device. In some examples, the control unit (12) of the semiconductor device is configured to generate a control signal (SON1) to activate and deactivate the electronic switch (T1) in accordance with the input signal (IN1), the control signal (SON1) being supplied to a control electrode of the electronic switch (T1) via a driver circuit (11) that generates a driver signal (SG) corresponding to the control signal (SON1) for driving the electronic switch (T1) on and off.

In one example, a method for controlling an electronic switch (T1) to activate or inactivate a load current path between a supply terminal (SUP) and an output circuit node (OUT1) using a state machine that has at least a first state (A), a second state (B), and a third state (C) of operation includes: monitoring the load current (iL), which passes through the load current path, and signaling an over-current when the load current (iL) reaches or exceeds an adjustable over-current threshold (STH), wherein the over-current threshold is set to a higher first value (SHI) while in the first state (A) and to a lower second value (SLO) while in the second state (B); generating a control signal (SON1) to activate and deactivate the electronic switch in accordance with an input signal (IN1); de-activating the electronic switch (T1) when an over-current is signaled and re-activating the electronic switch (T1) after a blanking time (TWAIT) unless a counter (countOC) indicates that an over-current has been detected for a pre-set maximum number (maxOC) of times, wherein the maximum number (maxOC) is higher in the first state (A) than in the second state (B); deactivating the electronic switch (T1) and changing to the third state (C) when either the maximum number of over-current events has been detected or another safety-relevant criterion is met until receiving a reset command; changing from the first state (A) to the second state (B) when a specific time span (TONmax) has elapsed; changing from the second state (B) to the first state (A) when the electronic (T1) switch has been off for at least a minimum off time (TOFFmin) or when a pre-defined minimum time span has elapsed since leaving the first state; changing from the third state (C) to the second state (B) when receiving the reset command.

In some examples, the pre-defined safety-relevant criterion of the method is inter alia: a temperature of the semiconductor device exceeds a pre-defined maximum temperature.

In some examples, the method further includes for determining when the specifis time (TON) span has elapsed: resetting a second timer (TON) before entering the first state (A); starting the second timer thus measuring the on-time (TON) when the electronic switch (T1) is activated while being in the first state (A); comparing the measured time with the maximum on time (TONmin) and signaling when the measured time equals or exceeds the maximum on time (TONmin).

In some examples, the input signal (IN1) of the method is an on/off-modulated signal having a switching period and a duty cycle and wherein the minimum off time (TOFFmin) or the pre-defined minimum time span, respectively, is at least 10 times of one switching period of the input signal. In some examples, the minimum off time (TOFFmin) of the method is long enough to allow the electronic switch to cool down to a specified temperature.

A semiconductor device is described. In accordance with a first example of the invention the semiconductor device includes an electronic switch that is configured to switch a load current path between a supply terminal having a supply voltage and an output circuit node on and off in accordance with an input signal. The device further includes an over-current detector that is configured to compare a load current signal that represents the load current passing through the load current path with an over-current threshold and to signal an over-current when the load current signal reaches or exceeds the over-current threshold. Furthermore, the device includes a control unit that is operable in a first and a second state of operation. The control unit is configured to set the over-current threshold to a first, higher value while in the first state of operation and to a second, lower value while in the second state of operation, and to at least temporarily switch the electronic switch off when an over-current is signalled. A change from the first state of operation to the second state of operation is caused when a first pre-defined time span has elapsed, and a change from the from the second state of operation to the first state of operation when the electronic switch is off for more than a second pre-defined time span.

Although various exemplary embodiments have been disclosed, it will be apparent to those skilled in the art that changes and modifications can be made according to a specific implementation of the various embodiments and without departing from the spirit and scope of the invention. It will be obvious to those reasonably skilled in the art that other components performing the same functions may be suitably substituted. Particularly, signal processing functions may be performed either in the time domain or in the frequency domain while achieving substantially equal results. It should be mentioned that features explained with reference to a specific figure may be combined with features of other figures, even where not explicitly mentioned. Further, the methods of the invention may be achieved in either all software implementations, using the appropriate processor instructions, or in hybrid implementations that utilize a combination of hardware logic and software logic to achieve the same results. Such modifications to the concept are intended to be covered by the appended claims.

The invention claimed is:

1. A semiconductor device comprising:
   an electronic switch that is configured to switch a load current path between a supply terminal having a supply voltage and an output circuit node on and off in accordance with an input signal;
   an over-current detector that is configured to compare a load current signal that represents the load current passing through the load current path with an over-current threshold and to signal an over-current when the load current signal reaches or exceeds the over-current threshold;
   a first timer configured to measure an off-time of the electronic switch, the timer being reset each time the electronic switch is activated and being only actively measuring time when the electronic switch is off; and
   a control unit operable in a first and a second state of operation and configured to:
     generate a control signal to switch the electronic switch on and off in accordance with the input signal;
     set the over-current threshold to a first, higher value while in the first state of operation and to set the over-current threshold to a second, lower value while in the second state of operation;
     at least temporarily switch the electronic off when an over-current is signalled;
     change from the first state of operation to the second state of operation when the off-time measured by the first timer indicates that a first pre-defined time span has elapsed; and
     change from the from the second state of operation to the first state of operation when the off-time measured by the first timer indicates that: the electronic switch has been off for more than a second pre-defined time span or that a pre-defined minimum time span has elapsed since leaving the first state.

2. The semiconductor device of claim 1, wherein the control unit is further operable in a third state of operation and configured to:
   change to the third state of operation when a pre-defined safety-relevant criterion is met;
   generate a control signal to switch the electronic switch off; and
   change from the third state of operation to the second state of operation when a reset command is received.

3. The semiconductor device of claim 2, wherein the pre-defined safety-relevant criterion is one or more of the following:
   an over-current is signalled for a pre-set maximum number of times; and
   a temperature of the semiconductor device exceeds a pre-defined maximum temperature,
   wherein the pre-set maximum number is different in different states of operation.

4. The semiconductor device of claim 1, further comprising: a second timer configured to measure an on-time, the timer being reset before or when the control unit changes to the first state of operation and being only actively measuring time when the control unit is in the first state of operation.

5. The semiconductor device of claim 1, wherein, in the first state of operation, the control unit is configured to:
- count the number of times an over-current is signalled by the over-current detector; and
- when an over-current is signalled, deactivate the electronic switch, and re-activate the electronic switch after a blanking time unless the counted number of over-current events has reached a maximum number.

6. The semiconductor device of claim 5, wherein the maximum number is different in the first state of operation and in the second state of operation.

7. The semiconductor device of claim 1, further comprising: a serial bus interface coupled to the control unit and configured to enable a data exchange between the control logic circuit and an external device.

8. The semiconductor device of claim 1, wherein the control unit is configured to generate a control signal to activate and deactivate the electronic switch in accordance with the input signal, the control signal being supplied to a control electrode of the electronic switch via a driver circuit that generates a driver signal corresponding to the control signal for driving the electronic switch on and off.

9. A method for controlling an electronic switch to activate or inactivate a load current path between a supply terminal and an output circuit node using a state machine that has at least a first state, a second state, and a third state of operation, the method comprising:
- monitoring the load current, which passes through the load current path, and signalling an over-current when the load current reaches or exceeds an adjustable over-current threshold, wherein the over-current threshold is set to a higher first value while in the first state and wherein the over-current threshold is set to a lower second value while in the second state;
- generating a control signal to activate and deactivate the electronic switch in accordance with an input signal;
- de-activating the electronic switch when an over-current is signalled;
- re-activating the electronic switch after a blanking time unless a counter indicates that an over-current has been detected for a pre-set maximum number of times, wherein the maximum number is higher in the first state than in the second state;
- deactivating the electronic switch and changing to the third state when either the maximum number of over-current events has been detected or other safety-relevant criterion is met until receiving a reset command;
- changing from the first state to the second state when a specific time span has elapsed;
- changing from the second state to the first state when the electronic switch has been off for at least a minimum off time or when a pre-defined minimum time span has elapsed since leaving the first state; and
- changing from the third state to the second state when receiving the reset command.

10. The method of claim 9, wherein the other pre-defined safety-relevant criterion comprises a temperature of the semiconductor device exceeding a pre-defined maximum temperature.

11. The method of claim 9 further comprising: determining when the specific time span has elapsed by at least:
- resetting a second timer before entering the first state;
- starting the second timer to measure the on-time when the electronic switch is activated while being in the first state; and
- comparing the measured time with the maximum on time and signalling when the measured time equals or exceeds the maximum on time.

12. The method of claim 9, wherein the input signal is a modulated signal having a switching period and a duty cycle and wherein the minimum off time or the pre-defined minimum time span, respectively, is at least ten times of one switching period of the input signal.

13. The method of claim 9, wherein the minimum off time is long enough to allow the electronic switch to cool down to a specified temperature.

* * * * *